(12) United States Patent
Zhou (10) Patent No.: US 11,955,550 B2
(45) Date of Patent: Apr. 9, 2024

(54) SEMICONDUCTOR DEVICE (71) Applicants: Semiconductor Manufacturing International (Shanghai) Corporation, Shanghai (CN); Semiconductor Manufacturing International (Beijing) Corporation, Beijing (CN)

(72) Inventor: Fei Zhou, Shanghai (CN)

(73) Assignees: Semiconductor Manufacturing International (Shanghai) Corporation, Shanghai (CN); Semiconductor Manufacturing International (Beijing) Corporation, Beijing (CN)

( * ) Notice: Subject to any disclaimer, the term of this patent is extended or adjusted under 35 U.S.C. 154(b) by 457 days.

(21) Appl. No.: 17/308,324

(22) Filed: May 5, 2021

(65) Prior Publication Data

US 2021/0273097 A1  Sep. 2, 2021

Related U.S. Application Data (62) Division of application No. 16/573,008, filed on Sep. 17, 2019, now Pat. No. 11,049,969.

(30) Foreign Application Priority Data

Nov. 1, 2018 (CN) .......................... 201811295011.1

(51) Int. Cl.
*H01L 29/78* (2006.01)
*H01L 21/02* (2006.01)
*H01L 21/306* (2006.01)
*H01L 21/308* (2006.01)
*H01L 21/762* (2006.01)
(Continued)

(52) U.S. Cl.
CPC .... *H01L 29/7846* (2013.01); *H01L 21/02164* (2013.01); *H01L 21/0217* (2013.01); *H01L 21/30604* (2013.01); *H01L 21/3086* (2013.01); *H01L 21/76229* (2013.01);
(Continued)

(58) Field of Classification Search
CPC .......... H01L 21/02164; H01L 21/0217; H01L 21/30604; H01L 21/3086; H01L 21/76229; H01L 21/823431; H01L 21/823821; H01L 21/845; H01L 27/0886; H01L 27/0924; H01L 27/1211; H01L 29/0642; H01L 29/0649; H01L 29/0653; H01L 29/41791; H01L 29/66795; H01L 29/7846;
(Continued)

(56) References Cited

U.S. PATENT DOCUMENTS

2017/0271499 A1   9/2017 Lee
2018/0006134 A1*  1/2018 Hong ................. H01L 21/3212
(Continued)

*Primary Examiner* — David C Spalla
(74) *Attorney, Agent, or Firm* — Anova Law Group, PLLC (57) ABSTRACT

Semiconductor devices is provided. The semiconductor structure includes a semiconductor substrate having a middle region and an edge region adjacent to the middle region, a plurality of first fins formed on the middle region of the semiconductor substrate, a plurality of second fins formed on the edge region of the semiconductor substrate, a first adjustment layer formed on sidewall surfaces of the plurality of first fins and on the middle region of the semiconductor substrate, and an isolation structure formed on the semiconductor substrate and with a top surface lower top surfaces of the plurality of first fins and the plurality of second fins.

10 Claims, 7 Drawing Sheets

(51) Int. Cl.
  *H01L 29/06* (2006.01)
  *H01L 29/66* (2006.01)
(52) U.S. Cl.
  CPC .... *H01L 29/0653* (2013.01); *H01L 29/66795* (2013.01); *H01L 29/7851* (2013.01)
(58) Field of Classification Search
  CPC .............. H01L 29/785; H01L 29/7851; H01L 29/7853; H01L 29/7855; H01L 2029/7858
  See application file for complete search history.

(56) References Cited

U.S. PATENT DOCUMENTS

| | | |
|---|---|---|
| 2019/0027595 A1 | 1/2019 | Zhou |
| 2019/0097053 A1* | 3/2019 | Cheng ................ H01L 29/0649 |
| 2019/0097056 A1* | 3/2019 | Kuo .................. H01L 21/76229 |
| 2020/0127133 A1 | 4/2020 | Zhou |

* cited by examiner

SEMICONDUCTOR DEVICE

CROSS-REFERENCES TO RELATED APPLICATIONS

This application is a divisional of U.S. patent application Ser. No. 16/573,008, filed on Sep. 17, 2019, which claims the priority of Chinese patent application No. 201810295011.1, filed on Nov. 1, 2018, the entirety of which is incorporated herein by reference.

FIELD OF THE DISCLOSURE

The present disclosure generally relates to the field of semiconductor manufacturing and, more particularly, relates to semiconductor devices and fabrication methods.

BACKGROUND

With the rapid development of the semiconductor manufacturing technologies, integrated circuits (ICs) are being developed toward higher component densities and higher integration level. As one of the basic components of ICs, semiconductor devices are widely used. A conventional planar device usually has a weak control on its channel current, and a short channel effect is easy to occur to have a leakage current issue. Thus, the electrical performance of the semiconductor devices is adversely affected.

To overcome the short channel effect of the semiconductor devices and suppress the leakage current, fin field-effect transistors (FinFETs) have been developed. FinFETs are a common type of multi-gate devices. The structure of an FinFET often includes a plurality of fins and an isolation layer on a surface of a semiconductor substrate. The isolation layer covers portions of the sidewall surfaces of the fins, and the top surface of the isolation layer is lower than the top surfaces of the fins. The FinFET also includes a gate structure on the surface of the isolation layer by covering the top and sidewall surfaces of the fins, and source/drain regions in the fins at both sides of the gate structure.

However, there is a need to further improve the performance of the semiconductor devices. The disclosed methods and semiconductor devices are directed to solve one or more problems set forth above and other problems in the art.

BRIEF SUMMARY OF THE DISCLOSURE

One aspect of the present disclosure includes a method for forming a semiconductor device. The method may include providing an initial base substrate having a middle region and an edge region adjacent to the edge region; forming a first opening in the middle region of the initial base substrate; forming a first adjustment layer on sidewall surfaces of the first opening; and forming a plurality of second openings with a depth greater than a depth of the first opening in the edge region of the initial base substrate. A portion of the initial base substrate between the first opening and a second opening forms a first fin; a portion of the initial base substrate between adjacent second openings forms a second fin; and portions of the initial base substrate under first fin, the second fins, the first opening, the second openings form a semiconductor substrate. The method also includes forming an isolation structure with a top surface lower than top surfaces of the first fin and the second fins on the surface of the initial base substrate.

Another aspect of the present disclosure includes a semiconductor device. The semiconductor device includes a semiconductor substrate having a middle region and an edge region adjacent to the middle region. A surface of the middle region of the semiconductor substrate is higher than a surface of the edge region of the semiconductor substrate. The semiconductor device may also include a plurality of first fins formed on the middle region of the semiconductor substrate; a plurality of second fins formed on the edge region of the semiconductor substrate; a first adjust layer formed on sidewall surfaces of the first fins and on the middle region of the semiconductor substrate; and an isolation structure formed on the surface of the semiconductor substrate and with a top surface lower the top surfaces of the first fins and the second fins.

Other aspects of the present disclosure can be understood by those skilled in the art in light of the description, the claims, and the drawings of the present disclosure.

BRIEF DESCRIPTION OF THE DRAWINGS

The following drawings are merely examples for illustrative purposes according to various disclosed embodiments and are not intended to limit the scope of the present disclosure.

DETAILED DESCRIPTION

Reference will now be made in detail to exemplary embodiments of the disclosure, which are illustrated in the accompanying drawings. Wherever possible, the same reference numbers will be used throughout the drawings to refer to the same or like parts.

Figure 1:
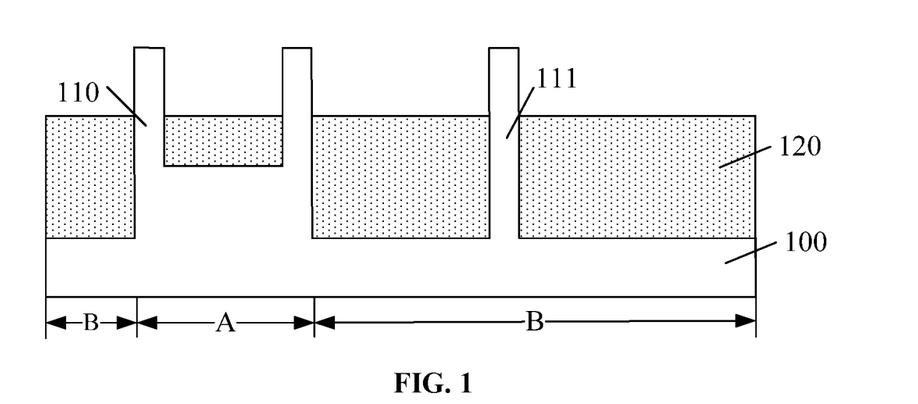
FIG. 1 illustrates a semiconductor device.

FIG. 1 illustrates a semiconductor device. As shown in FIG. 1, the semiconductor device includes a semiconductor substrate 100. The semiconductor substrate 100 includes a middle region A and an edge region B adjacent to the middle region A. The surface of the middle region A is higher than the edge region B of the surface of the semiconductor substrate 100. Further, the semiconductor device includes a plurality of discrete first fins 110 on the surface of the middle region A of the semiconductor substrate 100; and a plurality of discrete second fins 111 on the surface of the edge region B of the semiconductor substrate 100. Further, the semiconductor device includes an isolation structure 120 on the surface of the semiconductor substrate 100 in the middle region A and the edge region B. The surface of the isolation structure 120 is lower than the surfaces of the first fins 110 and the second fins 111; and the isolation structure 120 covers portions of the sidewall surfaces of the first fins 110 and the second fins 111.

As shown in FIG. 1, the portion of the isolation structure 120 in the edge region B is substantially thick, and the field isolation between the semiconductor device in the edge region B and the surrounding semiconductor devices can be realized. The portion of the isolation structure 120 in the middle region B is substantially thin, and the sidewall surfaces of the first fins 110 are covered less. Thus, the semiconductor devices formed on the first fins 110 are closer to the semiconductor substrate 100, and the heat is easily conducted to the semiconductor substrate 100, and the heat dissipation is substantially fast. Accordingly, the self-heating effect of the semiconductor devices is reduced. Further, the height of the portions of the first fins 110 higher than the isolation structure 120 is substantially the same as the height of the portions of the second fins 111 higher than the isolation structure 120. Thus, the performance of the semiconductor device is substantially stable; and such a structure improves the performance of the semiconductor device.

However, because the thicknesses of the portions of the isolation structure 120 at two sides of the first fins 110 in the middle region A are different, in particular, the thickness of the portion of the isolation structure 120 in the middle region A may be smaller than the thickness of the portion of the isolation structure 120 in the edge region B, the stress applied on the first fins 110 from the portion of the isolation structure 120 in the middle region A may be smaller than the stress applied on the first fins 110 from the portion of the isolation structure 120 from the edge region B. Thus, uneven stresses may be applied on the two sides of the first fins 110, and the first fins 110 may be susceptible to a bending deformation. Accordingly, the performance of the semiconductor device is adversely affected.

The present disclosure provides a semiconductor device and a method for forming a semiconductor device. In the method for forming the semiconductor device, a first opening may be formed in the middle region of an initial substrate; and a first adjustment layer may be formed on sidewall surfaces of the first opening to stabilize the first fins. The semiconductor device formed by the method may have a desired performance.

Figure 12:
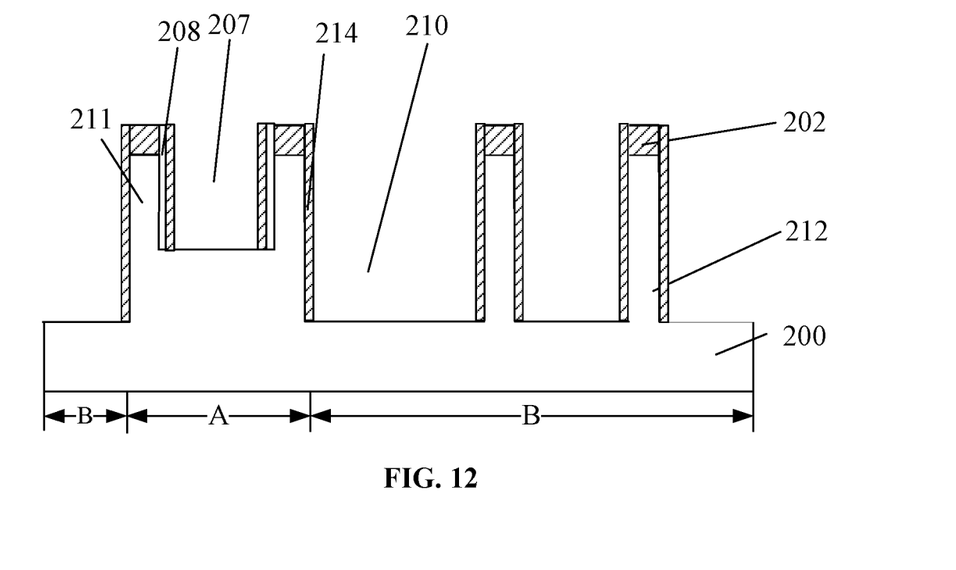
Figure 13:
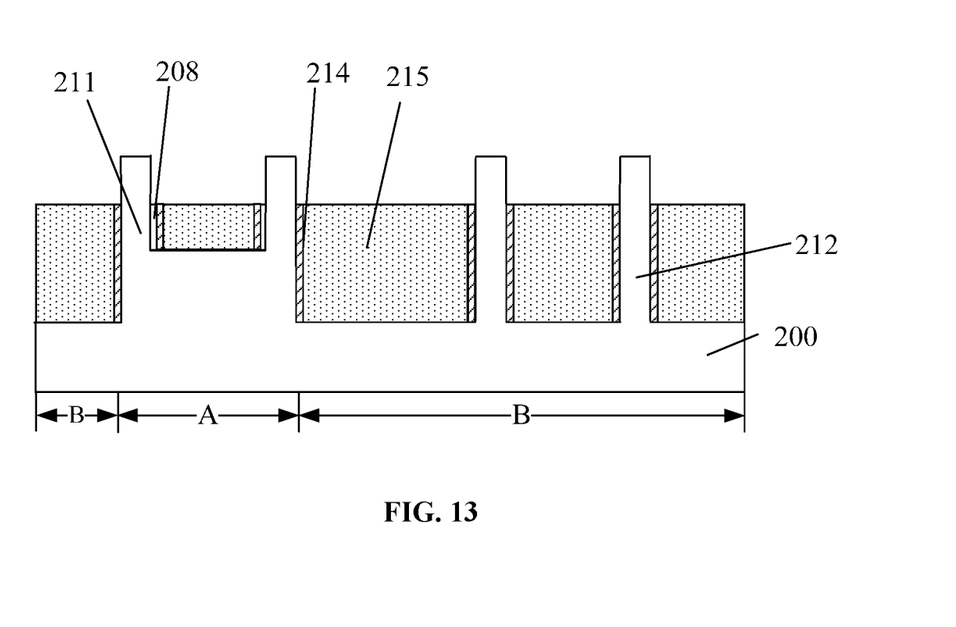
Figure 14:
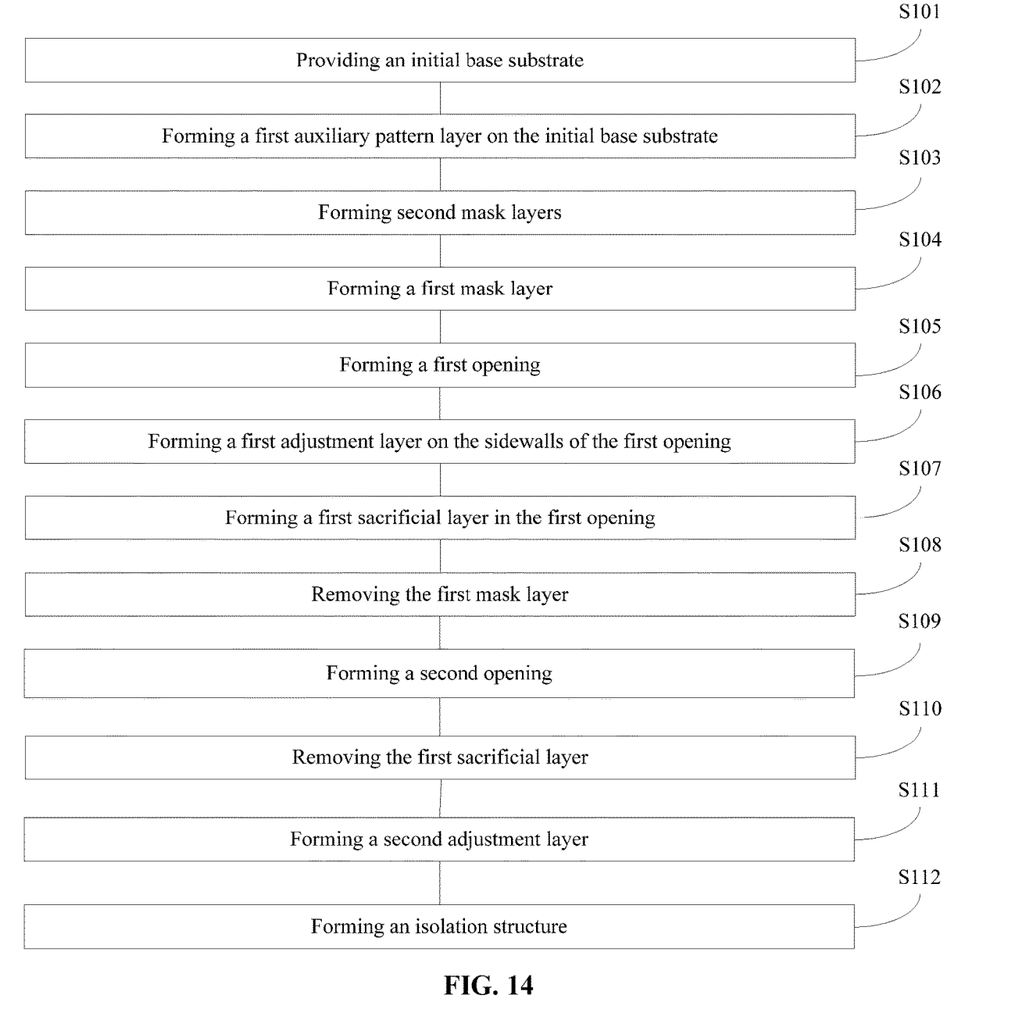
FIG. 14 illustrates an exemplary fabrication process of a semiconductor device consistent with various disclosed embodiments of the present disclosure.

FIG. 14 illustrates an exemplary method for forming a semiconductor device consistent with various disclosed embodiments. FIGS. 2-13 illustrate structures corresponding to certain stages during the exemplary fabrication process for forming the semiconductor device consistent with various disclosed embodiments.

Figure 2:
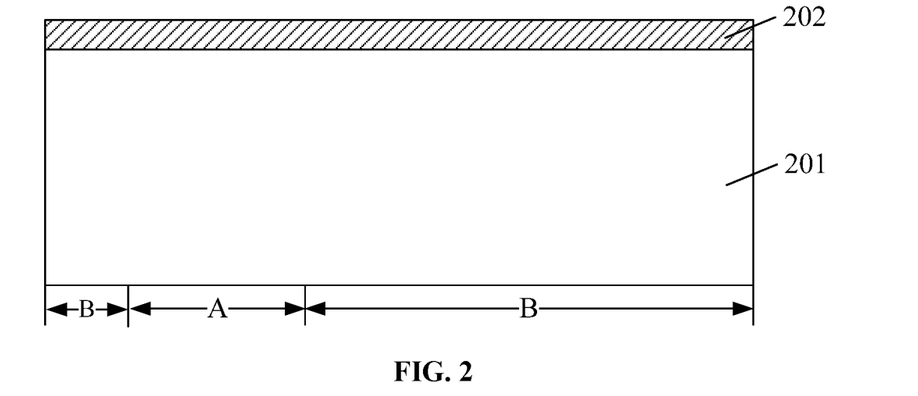
FIGS. 2-13 illustrate structures corresponding to certain stages during an exemplary fabrication process of a semiconductor device consistent with various disclosed embodiments of the present disclosure.

As shown in FIG. 14, at the beginning of the fabrication process, an initial base substrate with certain structures is provided (S101). FIG. 2 illustrates a corresponding semiconductor structure.

As shown in FIG. 2, an initial base substrate 201 is provided. The initial base substrate 201 may include a middle region A and an edge region B adjacent to the middle region A.

In one embodiment, the initial base substrate 201 is made of single crystal silicon. The initial base substrate 201 may also be made of polysilicon or amorphous silicon. In some embodiments, the initial base substrate 201 may also be a semiconductor material, such as germanium, silicon germanium or gallium arsenide, etc. In other embodiments, the initial base substrate 201 may also be a semiconductor-on-insulator structure including an insulator and a semiconductor material layer on the insulator. The semiconductor material layer may be made of a semiconductor material, such as silicon, germanium, silicon germanium, gallium arsenide, or indium gallium arsenide, etc.

In one embodiment, a protective layer 202 may be formed on the surface of the initial base substrate 201. The protective layer 202 may protect the initial base substrate 201.

The protective layer 202 may be made of any appropriate material, such as silicon oxide, silicon nitride, silicon carbonitride, silicon boronitride, silicon oxycarbonitride, or silicon oxynitride, etc. In one embodiment, the protective layer 202 is made of silicon oxide. In another embodiment, the protective layer 202 is made of silicon nitride.

Further, a first opening may be formed in the middle region of the initial base substrate by a first etching process.

The method for forming the first opening may include forming a first mask layer on the surface of the initial base substrate. The first mask layer may expose portions of the surface of the initial base substrate. Then, the initial base substrate may be etched using the first mask layer as an etching mask to form the first opening in the middle region of the initial base substrate.

In one embodiment, the method for forming the first mask layer may include forming a first auxiliary pattern layer on the initial base substrate. The first auxiliary pattern layer may cover portions of the surface of the initial base substrate. Then, an initial first mask layer may be formed on the surface of the initial base substrate. The initial first mask layer may cover the top and the sidewall surfaces of the first auxiliary pattern layer. Then, the initial first mask layer may be planarized until the top surface of the first auxiliary pattern layer is exposed to form the first mask layer. The first mask layer may cover the sidewall surfaces of the first auxiliary pattern layer.

In another embodiment, a first auxiliary pattern layer may be formed on the initial base substrate. The first auxiliary pattern layer may cover portions of the surface of the initial base substrate. Then, second mask layers may be formed on the sidewall surfaces of the first auxiliary pattern layer. The second mask layers may be formed on the surface of the initial base substrate and may cover the sidewall surfaces of the first auxiliary pattern layer. Then, the initial base substrate may be etched by using the first mask layer and the second mask layers as an etching mask, and the first opening may be formed in the middle region of the initial base substrate. Accordingly, the method for forming the first mask layer may include forming an initial first mask layer on the initial base substrate to cover the top surface of the first auxiliary pattern layer, and the top and sidewall surfaces of the second mask layers; and planarizing the initial first mask layer to expose the top surface of the first auxiliary pattern layer and the top surfaces of the second mask layers to form the first mask layer. The first mask layer may cover the sidewall surfaces of the second mask layers. The process for forming the first opening is described as following with reference to FIGS. 3-6.

Figure 3:
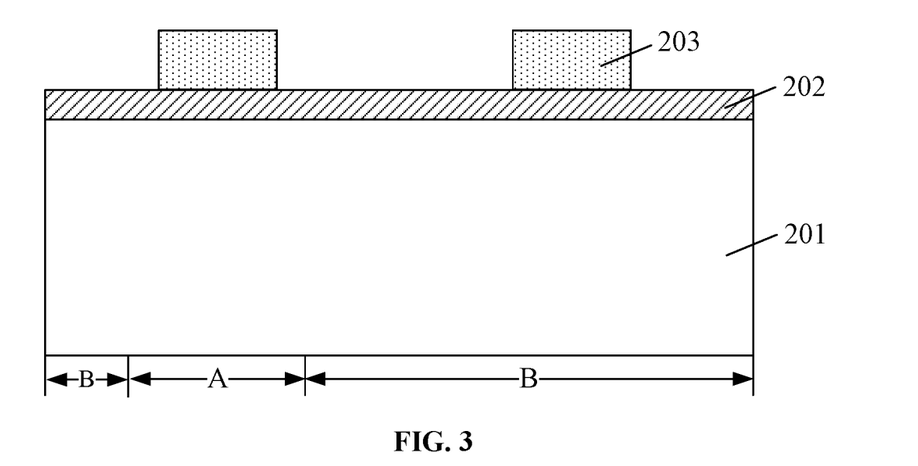

In particular, returning to FIG. 13, after providing the initial base substrate, a first auxiliary pattern layer may be formed (S102). FIG. 3 illustrates a corresponding semiconductor structure.

As shown in FIG. 3, a first auxiliary pattern layer 203 may be formed on the initial base substrate 201. The first auxiliary pattern layer 203 may include a plurality of first auxiliary patterns (not labeled). The first auxiliary pattern layer 203 may cover portions of the surface of the initial base substrate 201. In particular, the first auxiliary pattern layer 203 may be formed on the surface of the protective layer 202.

The first auxiliary pattern layer 203 may assist to subsequently form a first mask layer. The first auxiliary pattern layer 203 may determine the position and the shape of the subsequently formed first opening. The distances between any two adjacent first auxiliary patterns of the first auxiliary pattern layer 203 may be substantially equal.

The method for forming the first auxiliary pattern layer 203 may include forming an initial first auxiliary pattern layer on the surface of the initial base substrate 201 (not shown); and forming a second patterned layer on the surface of the initial first auxiliary pattern layer (not shown). The second patterned layer may expose portions of the surface of the initial first auxiliary pattern layer. Then, the initial first auxiliary pattern layer may be etched using the second patterned layer as a mask until the surface of the protective layer 202 is exposed; and the first auxiliary pattern layer 203 having a plurality of first auxiliary patterns may be formed on the surface of the protective layer 202.

In one embodiment, the first auxiliary pattern layer 203 may also be formed on the surface of the edge region B of the initial base substrate 201. In another embodiment, the first auxiliary pattern layer 203 may only be formed on the surface of the middle region A of the initial substrate 201.

The initial first auxiliary pattern layer may be made of any appropriate material, such as amorphous carbon, or amorphous silicon, etc. In one embodiment, the initial first auxiliary pattern layer is amorphous carbon. The size of the auxiliary patterns of the first auxiliary pattern layer 203 may determine the distances between adjacent subsequently formed first fins.

Figure 4:
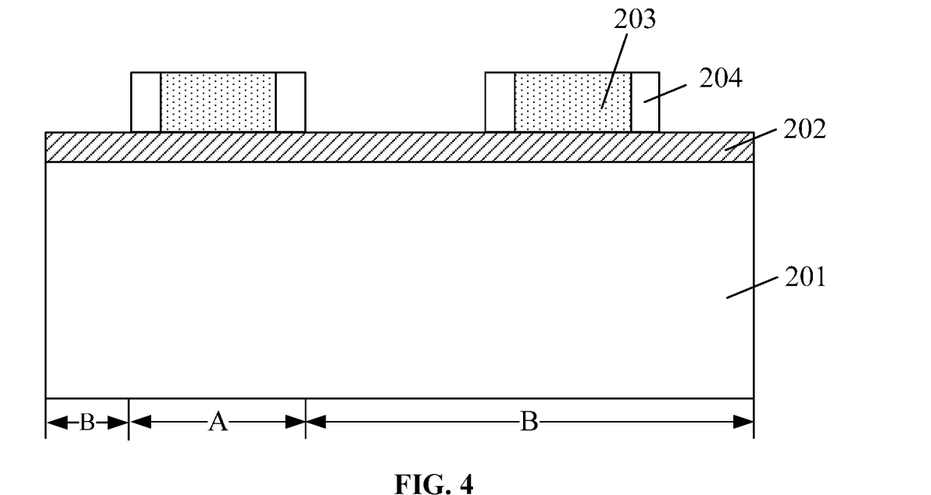

Returning to FIG. 14, after forming the first auxiliary pattern layer, second mask layers may be formed (S103). FIG. 4 illustrates a corresponding semiconductor structure.

As shown in FIG. 4, after forming the first auxiliary pattern layer 203, second mask layers 204 may be formed on the initial base substrate 201. One second mask layer 204 may cover one of the sidewall surfaces of the first auxiliary patterns of the first auxiliary pattern layer 203. In one embodiment, the second mask layers 204 may also be formed on the protective layer 202.

The second mask layers 204 may be used as a mask layer for subsequently forming the first fins and the second fins. The second mask layers 204 may also protect the surface of the initial base substrate 201 when forming the first opening and the second opening. Further, the second mask layers 204 may determine the positions and shapes of the subsequently formed first fins and second fins.

The second mask layers 204 may be made of any appropriate material, such as silicon oxide, silicon nitride, silicon carbonitride, silicon boronitride, silicon oxycarbonitride, or silicon oxynitride, etc. In one embodiment, the second mask layers 204 are made of silicon nitride.

The method for forming the second mask layers 204 may include forming an initial second mask layer (not shown) on the initial base substrate 201. The initial second mask layer may cover the surface of the protective layer 202 and top surfaces and sidewall surfaces of the first auxiliary patterns of the first auxiliary pattern layer 203. Then, the initial second mask layer may be etched back until the surface of the protective layer 202 is exposed to form one second mask layer 204 on each of the sidewall surfaces of the first auxiliary patterns of the first auxiliary pattern layer 203.

In one embodiment, the distances between any two adjacent first auxiliary patterns of the first auxiliary pattern layer 203 may be substantially equal. Further, the widths of the second mask layers 204 along a direction parallel to the surface of the initial base substrate 201 and perpendicular to the distribution direction the first auxiliary patterns of the first auxiliary pattern layers 203 may be substantially equal.

In another embodiment, the distances between two adjacent first auxiliary patterns of the first auxiliary pattern layer 203 may not be equal; and the widths of the second mask layers 204 along the direction parallel to the surface of the initial substrate and perpendicular to the distribution direction of the first auxiliary patterns of the first auxiliary pattern layer 203 may not be equal. The sizes of the subsequently formed first fins and second fins along the direction parallel to the surface of the initial substrate and perpendicular to the distribution direction of the first auxiliary patterns of the first auxiliary pattern layer 203 may not be equal.

Figure 5:
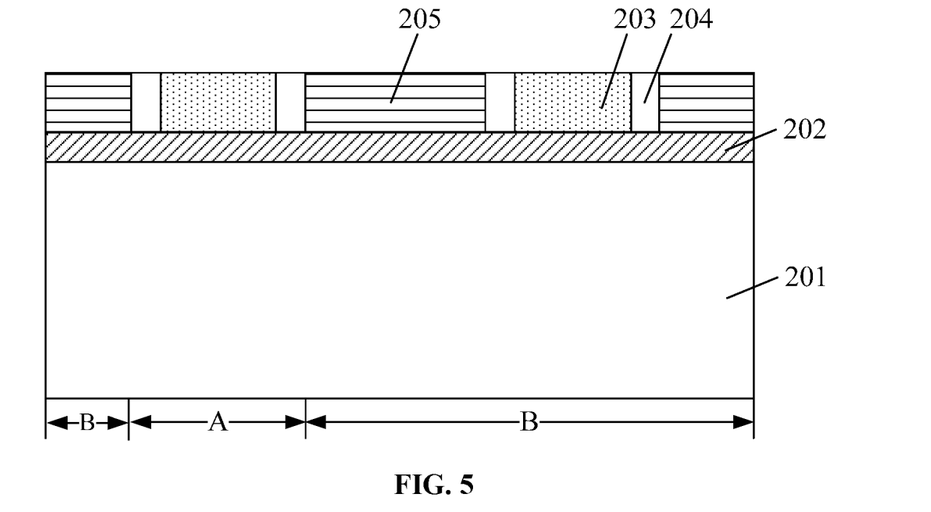

Returning to FIG. 14, after forming the second mask layers, a first mask layer may be formed (S104). FIG. 5 illustrates a corresponding semiconductor structure.

As shown in FIG. 5, after forming the second mask layers 204, a first mask layer 205 may be formed on the initial base substrate 201. The first mask layers 205 may cover the top surface of the protective layer 202 and the sidewall surfaces of the second mask layers 204; and may fill the gaps between the adjacent second mask layers 204. The second mask layers 204 and the first mask layer 205 may together be used as a mask layer for subsequently forming a first opening.

The method for forming the first mask layer 205 may include forming an initial first mask layer (not shown) on the initial base substrate 201. The initial first mask layer may cover the top surface of the first auxiliary pattern layer 203 and the top and sidewall surfaces of the second mask layers 204; and fill the gaps between adjacent second mask layers 204. Then, the initial first mask layer may be planarized to expose the top surface of the first auxiliary pattern layer 203 and the top surfaces of the second mask layers 204 to form the first mask layer 205.

The first mask layer 205 may be made of any appropriate material, such as silicon oxide, silicon nitride, silicon oxynitride, silicon boronitride, silicon oxycarbonitride, or silicon oxynitride, etc. In one embodiment, the first mask layer 205 is made of silicon oxide.

The materials of the first mask layer 205, the second mask layers 204, and the first auxiliary pattern layer 203 may be different from each other.

Figure 6:
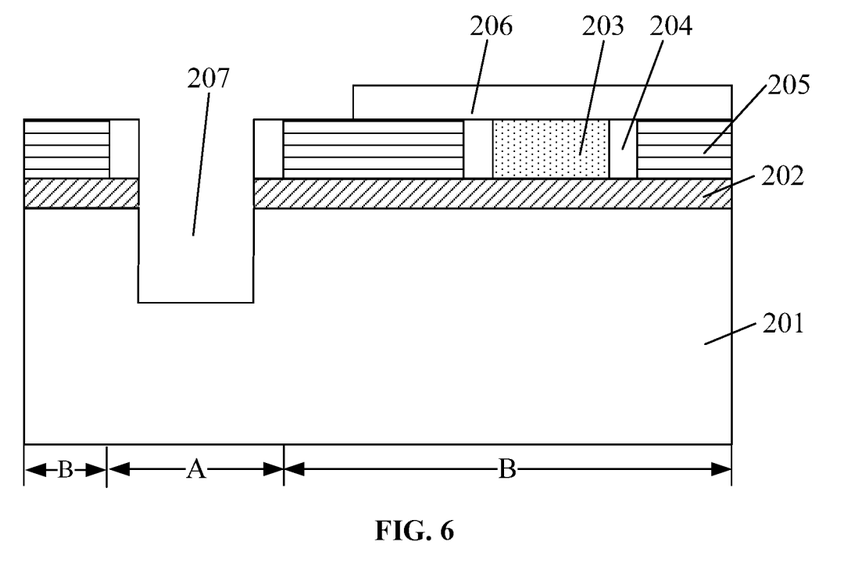

Returning to FIG. 14, after forming the first mask layer, a first opening may be formed (S105). FIG. 6 illustrates a corresponding semiconductor structure.

As shown in FIG. 6, after forming the first mask layer 205, a first opening 207 may be formed in the middle region A of the initial base substrate 201. The first opening 207 may be formed by etching the initial base substrate 201 using the second mask layers 204 and the first mask layer 205 as an etching mask. The bottom surface of the first opening 207 may be lower than the top surface of the initial base substrate 201.

The distance from the bottom surface of the first opening 207 to the top surface of the initial base substrate 201 may be the height of the subsequently formed first fins. In one embodiment, the distance between the bottom surface of the first opening 207 and the top surface of the initial base substrate 201 may be in a range of approximately 600 angstroms to 900 angstroms.

Before etching the initial base substrate 201 to form the first opening 207, the first auxiliary patterns of the first auxiliary pattern layer 203 and portions of the protective layer 202 on the surface of the initial base substrate 201 may be removed to expose portions of the surface of the initial base substrate 201 and the sidewall surfaces of the second mask layers 204. In one embodiment, the first opening 207 may only be formed in the middle region A of the initial base substrate 201. Thus, only the first auxiliary pattern of the first auxiliary pattern layer 203 in the middle region A and the portion of the protective layer 202 on the surface of the middle region A of the initial base substrate 201 may be removed.

Various processes may be used to remove the first auxiliary pattern of the first auxiliary pattern layer 203 in the middle region A. In one embodiment, the process for removing the first auxiliary pattern of the first auxiliary pattern layer 203 in the middle region A is an anisotropic dry etching process.

In one embodiment, the parameters of the dry etching process for removing the first auxiliary pattern of the first auxiliary pattern layer 203 in the middle region A may include a following combination. The etching gas may include $CF_4$, $O_2$, and He, etc. The flow rate of $CF_4$ may be in a range of approximately 20 sccm-300 sccm. The flow rate of $O_2$ may be in a range of approximately 50 sccm-800 sccm. The flow rate of He may be in a range of approximately 10 sccm-60 sccm. The chamber pressure may be in range of approximately 1 mTorr-200 mTorr. The power of the RF source may be in a range of approximately 500 W-2000 W. The bias voltage may be in a range of approximately 100V-300V. The etching time may be in a range of approximately 20 seconds-2000 seconds.

Various processes may be used to remove the portion of the protective layer 202 on the surface of the middle region A of the initial base substrate 201. In one embodiment, the process for removing the portion of the protective layer 202 on the surface of the middle region A of the initial base substrate 201 is an anisotropic dry etching process.

In one embodiment, before removing the first auxiliary pattern of the first auxiliary pattern layer 203 in the middle region A, a third patterned layer 206 may be formed on the surface of the edge region B. The third patterned layer 206 may cover the first mask layer 205 in the edge region B and the top surfaces of the second mask layers 204 and the top surface of the first auxiliary pattern layer 203 in the second region B.

In another embodiment, the third patterned layer 206 may not be formed. During the process for removing the first auxiliary pattern layer 203 in the middle region A, the first auxiliary pattern of the first auxiliary pattern layer 203 in the edge region B may be removed, and a third opening may be formed in the edge region B of the initial base substrate 201.

Figure 7:
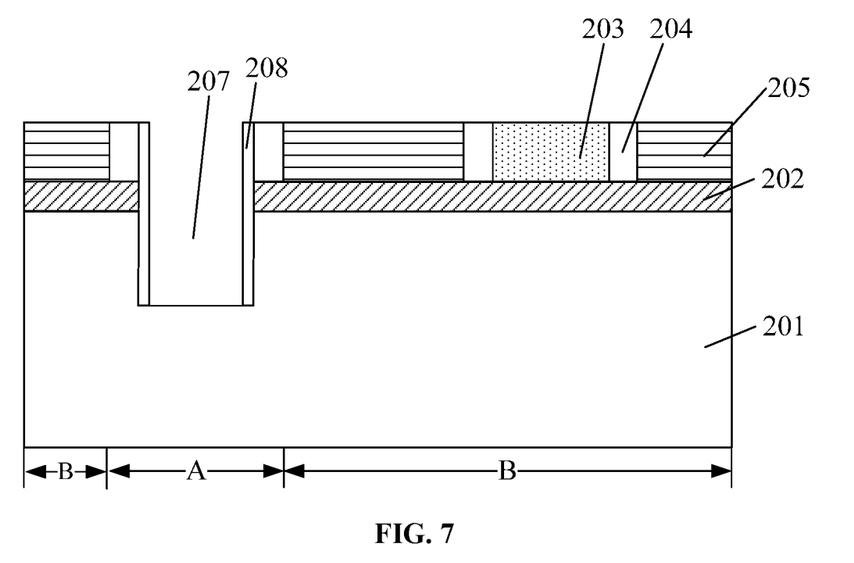

Returning to FIG. 14, after forming the first opening, a first adjustment layer may be formed (S106). FIG. 7 illustrates a corresponding semiconductor structure.

As shown in FIG. 7, after forming the first opening 207, a first adjustment layer 208 may be formed on the sidewall surfaces of the first opening 207. In one embodiment, the first adjustment layer 208 may cover only the sidewall surfaces of the first opening 207 in the middle region A. In another embodiment, the first adjustment layer 208 may cover not only the sidewall surfaces of the first opening 207 in the middle region A, but also the sidewall surfaces of the third opening in the edge region B.

The method for forming the first adjustment layer 208 may include forming a first adjustment material layer (not shown) on the inner surfaces of the first opening 207 by covering the bottom surface and the sidewall surfaces of the first opening 207 and the top surface of the initial base substrate 201; and etching back the first adjustment material layer until the bottom surface of the first opening 207 and the top surface of the initial base substrate 201 are exposed to form the first adjustment layer 208.

Various processes may be used to form the first adjustment material layer, such as a chemical vapor deposition (CVD) process, a physical vapor deposition (PVD) process, or an atomic layer deposition (ALD) process, etc.

In one embodiment, after forming the first adjustment layer 208 and before subsequently forming a second opening, the third patterned layer 206 in the edge region B may be removed. Various processes may be used to remove the third patterned layer 206 in the edge region B, such as an ashing process, or a wet process, etc.

The first adjustment material layer may be made of any appropriate material, such as silicon oxide, or silicon nitride, etc. Correspondingly, the first adjustment layer 208 may be made of silicon oxide, or silicon nitride, etc. In one embodiment, the first adjustment layer 208 is made of silicon nitride.

The thickness of the first adjustment layer 208 may be in a range of approximately 8 angstroms to 30 angstroms. When the first adjustment layer 208 is too thick, the distance between the two facing portions of the first adjustment layer 208 on the sidewall surfaces of the first opening 207 may be substantially small. Thus, the depth-to-width ratio of the first opening 207 with the adjustment layer 208 may be substantially large. Accordingly, it may be difficult for subsequently filling a material in the first opening 207, and the performance of the formed semiconductor device may be not as desired. When the first adjustment layer 208 is too thin, the support and stabilization effect of the first adjustment layer 208 to the portions of the initial base substrate 201 covered by the first adjustment layer 208 may be substantially small, and may be unable to effectively increase the stability of the subsequently formed first fins. Accordingly, it is unable effectively resist the stress unevenness of the subsequently first fins caused by the thickness differences of the portions of the isolation structure at two sides of the first fins. As a result, the first fins may be easily bent; and the performance of the semiconductor device may be not as desired.

After forming the first adjustment layer 208, a second etching process may be performed on the edge region B of the initial base substrate 201 to form a second opening. The bottom surface of the second opening may be lower than the bottom surface of the first opening. The portion of the initial base substrate 201 between the second opening and the adjacent first opening may form a first fin, and the portion of the initial base substrate 201 between adjacent second openings may form a second fin. The portion of the initial base substrate 201 under the first fin, the second fin, the first opening and the second opening may form a semiconductor substrate. The process for forming the second opening is described below with reference to FIGS. 8-10.

Figure 8:
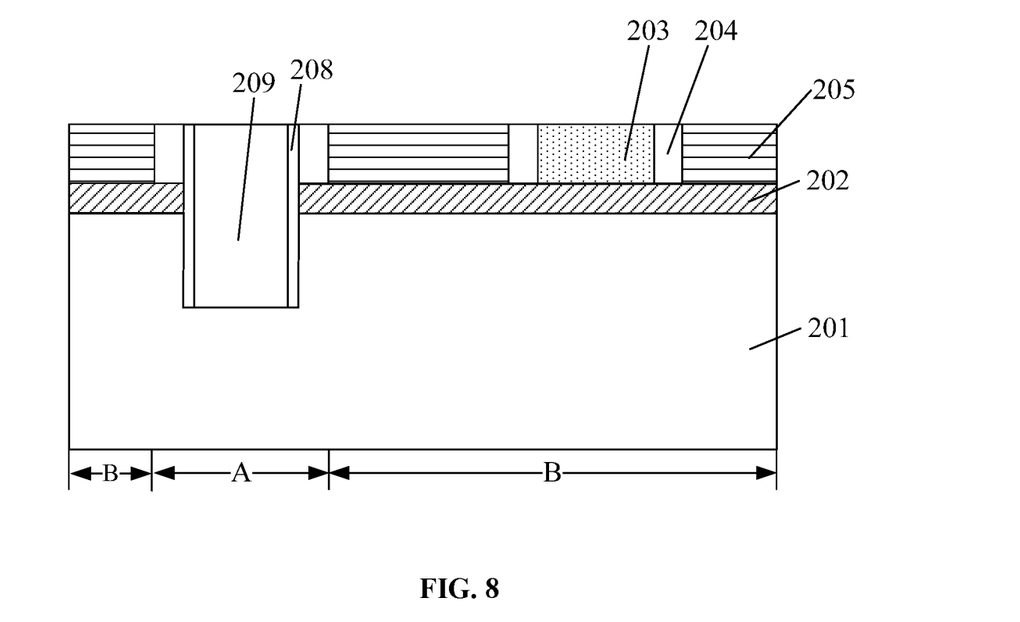

In particular, returning to FIG. 14, after forming the first adjustment layer, a first sacrificial layer may be formed (S108). FIG. 8 illustrates a corresponding semiconductor structure.

As shown in FIG. 8, after forming the first adjustment layer 208, a first sacrificial layer 209 may be formed in the first opening 207. The first sacrificial layer 209 may protect the initial base substrate 201 at the bottom of the first opening 207 when subsequently forming the second opening.

The first sacrificial layer 209 may be made of any appropriate material. In one embodiment, the first sacrificial layer 209 is made of an organic material.

The method for forming the first sacrificial layer 209 may include filling a first sacrificial material layer (not shown) in the first opening 207. A surface of the first sacrificial material layer may be higher than the top surface the first mask layer 205 and the top surfaces of the second mask layers 204. Then, the first sacrificial material layer may be planarized to form the first sacrificial layer 209 in the first opening 207. The first sacrificial layer 209 may cover the sidewall surfaces of the first adjustment layer 208.

In one embodiment, the first sacrificial layer 209 may only be formed in the first opening 207 in the middle region A. In another embodiment, the third opening may be formed in the edge region B, and the second sacrificial layer may also be formed in the third opening when forming the first sacrificial layer 208 in the first opening 207.

Figure 9:
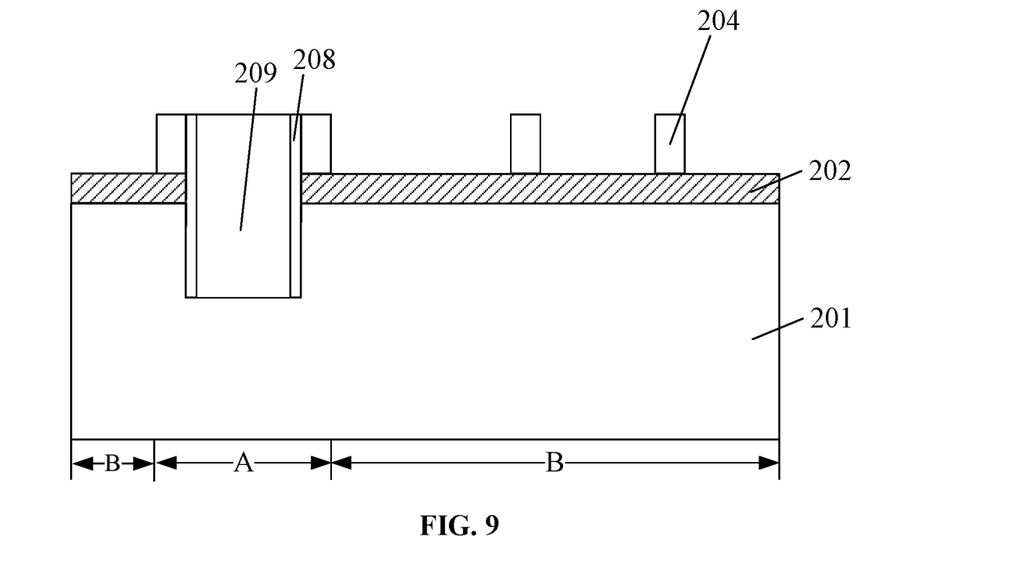

Returning to FIG. 14, after forming the first sacrificial layer 209, the first mask layer may be removed (S108). FIG. 9 illustrates a corresponding semiconductor structure.

As shown in FIG. 9, after forming the first sacrificial layer 209, the first mask layer 205 on the initial substrate 201 may be removed to expose the sidewall surfaces of the second mask layers 204 and the top surfaces of the portions of the protective layer 202.

In one embodiment, before the first mask layer 205, the first auxiliary pattern layer 203 in the edge region B may also be removed to expose the sidewall surfaces of the second mask layers 204 and the top surface of the protective layer 202.

Various processes may be used to remove the first auxiliary pattern layer 203 in the edge region B, such as a dry etching, etc. The parameters of the dry etching process may have a following combination.

The etching gases of the dry etching process may include $CF_4$, $O_2$ and He, etc. The flow rate of $CF_4$ may be in a range of approximately 20 sccm-300 sccm. The flow rate of $O_2$ may be in a range of approximately 50 sccm-800 sccm. The flow rate of He may be in a range of approximately 10 sccm-60 sccm. The chamber pressure may be in a range of approximately 1 mTorr-200 mTorr. The power of the RF source may be in a range of approximately 500 W-2000 W. The bias voltage may be in a range of approximately 100V-300V. The etching time may be in a range of approximately 20 seconds-2000 seconds.

Various processes may be used to remove the first mask layer 205. In one embodiment, the first mask layer 205 is removed by a dry etching process.

In one embodiment, the parameters of the dry etching process may include a following a combination. The etching gases may include $CH_4$, $H_2$, and $N_2$, etc. The flow rate of $CH_4$ may be in a range of approximately 15 sccm-200 sccm. The flow rate of $H_2$ may be in a range of approximately 300 sccm-900 sccm. The flow rate of $N_2$ may be in a range of approximately 20 sccm-150 sccm. The power of the RF source may be in a range of approximately 800 watts-2200 watts. The bias voltage may be in a range of approximately 80 volts-200 volts. The chamber pressure may be in a range of approximately 10 mTorr to 2000 mTorr. The etching time may be in a range of approximately 10 seconds-500 seconds.

The second mask layers 204 may be used as a mask layer for subsequently forming the first fins and the second fins.

Figure 10:
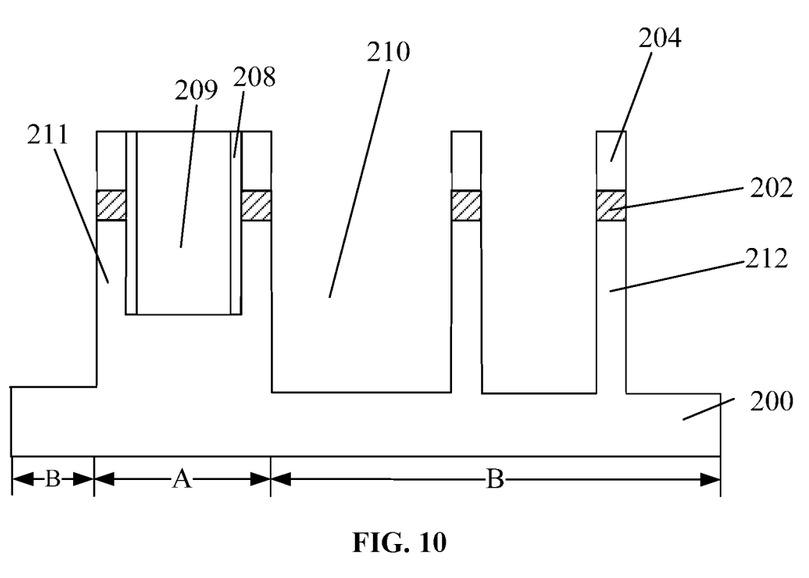

Returning to FIG. 14, after removing the first mask layer, a second opening may be formed (S109). FIG. 10 illustrates a corresponding semiconductor structure.

As shown in FIG. 10, after removing the first mask layer 205, the edge region B of the initial base substrate 201 may be etched by using the first sacrificial layer 209 and the second mask layers 204 as a mask to form a second opening 210. The bottom surface of the second opening 210 may be lower than the bottom surface of the first opening 207.

The portion of the initial base substrate 201 between the second opening 210 and an adjacent first opening 207 may form a first fin 211. The portion of the initial base substrate 201 between two adjacent second openings 210 may form a second fin 212. The portions of the initial base substrate 201 under the first fin 211, the second fin 212, the bottom of the first opening 207 and the bottom of the second opening 209 may form a semiconductor substrate 200.

The surface of the middle region A of the semiconductor substrate 200 may be higher than the surface of the edge region B of the semiconductor substrate 200. The height difference between the surface of the middle region A of the semiconductor substrate 200 and the surface of the edge region B of the semiconductor substrate 200 may be in a range of approximately 400 angstroms to 600 angstroms.

The distance between the top surface of the first fin 211 and the surface of the middle region A of the semiconductor substrate 200 may be in a range of approximately 600 angstroms to 900 angstroms. The distance between the top surface of the second fin 212 and the surface of the edge region B of the semiconductor substrate 200 may be in a range of approximately 1000 Å to 1500 Å.

Figure 11:
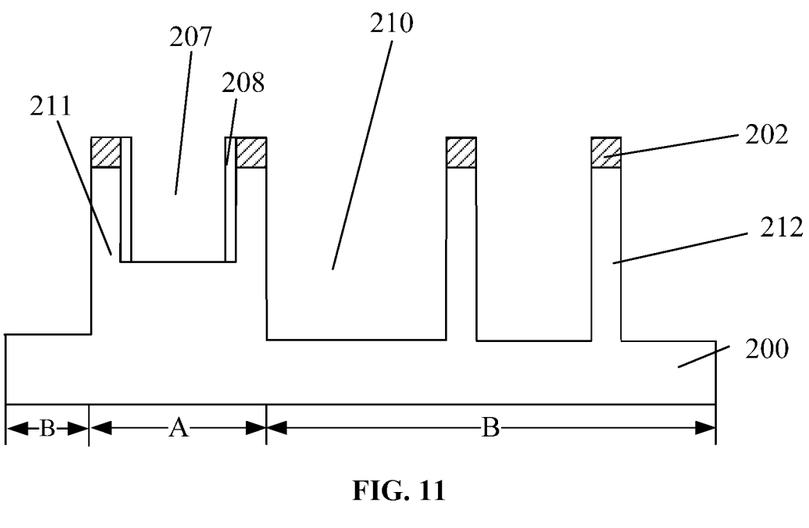

Returning to FIG. 14, after forming the second opening, the first sacrificial layer may be removed (S110). FIG. 11 illustrates a corresponding semiconductor structure.

As shown in FIG. 11, after forming the second opening 210, the first sacrificial layer 209 may be removed to expose the sidewall surfaces of the first adjustment layer 208 and the bottom surface of the first opening 207.

Various processes may be used to remove the first sacrificial layer 209. In one embodiment, the first sacrificial layer 209 may be removed by an ashing process. The gases used in the ashing process may include $N_2$ and $H_2$, etc. The flow rate of $N_2$ may be in a range of approximately 2000 sccm-4000 sccm. The flow rate of $H_2$ may be in a range of approximately 300 sccm-1000 sccm. The chamber pressure may be in a range of approximately 200 mTorr-900 mTorr. The power of the RF source may be in a range of approximately 1000 W-2700 W, and the temperature may be in a range of approximately 100° C.-350° C.

In one embodiment, the second sacrificial layer formed in the edge region may also be removed to expose the sidewall surfaces of the first adjustment layer in the edge region and the bottom surface of the third opening.

After removing the first sacrificial layer 209, the portions of the first adjustment layer 208 on the sidewall surfaces of the first opening 207 may be exposed.

In one embodiment, after removing the first sacrificial layer 209, the second mask layers 204 and a portion of the first adjustment layer 208 on the semiconductor substrate 200 and covering the sidewall surfaces of the second mask layers 204 may also be removed.

Returning to FIG. 14, after removing the first sacrificial layer, a second adjustment layer may be formed (S111). FIG. 12 illustrates a corresponding semiconductor structure.

As shown in FIG. 12, a second adjustment layer 214 may be formed on the portions of the sidewall surfaces of the first fin 211 and the sidewall surfaces of the second fin 212 and the sidewall surfaces of the first adjustment layer 208 in the first opening 207.

The process for forming the second adjustment layer 214 may include a CVD process, a PVD process, or an ALD process, etc. The second adjustment layer 214 may be made of silicon oxide, or silicon nitride, etc. In one embodiment, the second adjustment layer 214 is made of silicon nitride.

The second adjustment layer 214 may protect the first fin 211 and the second fin 214 from being affected during a subsequent etching process for forming an isolation structure. At the same time, the portion of the second adjustment layer 214 covering the first fin 211 may further stabilize the first fin 211. Thus, it may facilitate to resist the uneven stress on the first fin 211 caused by the thickness difference at the two sides of the subsequently formed isolation structure. Accordingly, it may facilitate to avoid the bending of the first fin 211; and the performance of the semiconductor device may be enhanced.

The thickness of the second adjustment layer 214 may be in a range of approximately 10 angstroms to 35 angstroms.

Returning to FIG. 14, after forming the second adjustment layer, an isolation structure may be formed (S112). FIG. 13 illustrates a corresponding semiconductor structure.

As shown in FIG. 13, an isolation structure 215 may be formed on the surface of the semiconductor substrate 200. The isolation structure 215 may cover portions of the sidewall surfaces of the first fin 211 and the second fin 212.

The process for forming the isolation structure 215 may include forming an initial isolation film (not shown) on the semiconductor substrate 200. The initial isolation film may cover the top surface of the protective layer 202 on the portions of the first fin 211 and the second fin 212. Then, the initial isolation film may be planarized until the surface of the protective layer 202 on the top surfaces of the first fin 211 and the second fin 213 is exposed; and etched back the initial isolation film to form the isolation structure 215.

The distance between the top surface of the isolation structure 215 and the surface of the edge region B may be in a range of approximately 500 angstroms to 600 angstroms.

The surface of the middle portion A of the semiconductor substrate 200 may be higher than the surface of the edge portion B of the semiconductor substrate 200. The first fin 211 may be formed in the middle region A; and the second fin 212 may be formed in the edge region B. Further, the portion of the isolation structure 215 in the middle region A may be relatively thin; and the portion of the isolation structure 215 in the edge region B may be relatively thick. Thus, on the one hand, the isolation structure 215 in the edge region B may be substantially thick, and the middle region A and the edge region B may be well separated. On the other hand, the isolation structure 215 in the middle region A may be substantially thin, and the sidewall surfaces of the first fin 211 may be covered less. Thus, the semiconductor device formed on the first fin 211 may be closer to the base substrate, and the heat may be easily transmitted to the base substrate. Accordingly, the heat dissipation may be substantially fast; and the self-heating effect of the semiconductor device may be reduced. Further, the height of the portion of the first fin 211 higher than the isolation structure 215 may be the same as the height of the portion of the second fin 212 higher than the isolation structure 215. Thus, the performance of the semiconductor device may be stabilized; and the performance of the semiconductor device may be improved.

The initial isolation film may be made of any appropriate material, such as silicon oxide, or silicon nitride, etc. In one embodiment, the initial isolation film is made of silicon oxide.

Various processes may be used to form the initial isolation film. In one embodiment, the initial isolation film is formed by an flowable chemical vapor deposition (FCVD) process. The FCVD process may include forming a silicon-containing precursor on the semiconductor substrate 200. The silicon-containing precursor may fill the first opening 207 and the second opening 210, and may cover the top and sidewall surfaces of the first fin 211 and the top and sidewall surfaces of the second fin 212. Then, the silicon-containing precursor may be oxidized to form an initial isolation material film (not shown); and the initial isolation material film may be annealed to form the initial isolation film.

The initial isolation film formed by the FCVD process may have a stress and, correspondingly, the isolation structure 215 may have a stress. Because the thickness of the isolation structure 215 at two sides of the first fin 211 may be different, the stresses at the sides of the first fin 211 may be different. Thus, the first fin 211 may be easily bent. The first adjustment layer 208 formed on the surface of the middle region A of the semiconductor substrate 200 and the second adjustment layer 214 formed on the surface of the edge region B of the semiconductor substrate 200 may be able to stabilize the first fin 211 covered by the first adjustment layer 208 and the second adjustment layer 214. Thus, the bending of the first fin 208 may be prevented; and the performance of the semiconductor device may be improved.

In some embodiments, the initial isolation film may be formed by a plasma enhanced chemical vapor deposition (PECVD) process; or a high aspect ratio chemical vapor deposition process (HARP), etc.

In one embodiment, the exposed portion of the first adjustment layer 208 and the exposed portion of the second adjustment layer 214 and the protective layer 202 on the top surfaces of the first fin 211 and the second fin 212 may be removed.

In one embodiment, the exposed portion of the first adjustment layer 208, the exposed portion of the second adjustment layer 214 and the protective layer 202 on the top surfaces of the first fin 211 and the second fin 212 may be removed when forming the isolation structure to reduce the process steps and the production cost.

The present disclosure also provides a semiconductor device. FIG. 13 illustrates an exemplary semiconductor device consistent with various disclosed embodiments.

As shown in FIG. 13, the semiconductor device includes a semiconductor substrate 200. The semiconductor substrate 200 may include a middle region A and an edge region B. The edge region B may be adjacent to the middle region A. The surface of the region A of the semiconductor substrate 200 may be higher than the surface of the edge region B of the semiconductor substrate 200. The semiconductor device may also include a plurality of discrete first fins 211 formed on the surface of the middle region A of the semiconductor substrate 200; and a plurality of discrete second fins 212 formed on the surface of the edge region B of the semiconductor substrate 200. Further, the semiconductor device may include a first adjustment layer 208 formed on the middle region A of the semiconductor substrate 200 and covering portions of sidewall surfaces of the first fins 211; and an isolation structure 215 formed on the surface of the semiconductor substrate 200. The top surface of the isolation structure 215 may be lower than the top surfaces of the first fins 211 and the second fins 212. Further, the semiconductor device may include a second adjustment layer 214 formed on the surface of the semiconductor substrate 200. The second adjustment layer 214 may cover portions of the sidewall surfaces the first fins 211 and the second fins 212 and the sidewall surfaces of the first adjustment layer 208. The isolation structure 215 may cover portions of the sidewall surfaces of the second adjustment layer 214. The detailed structures and intermediate structures are described above with respect to the fabrication processes.

The first adjustment layer 208 may be made of any appropriate material, such as silicon nitride, or silicon oxide, etc. The thickness of the first adjustment layer 208 may be in a range of approximately 8 angstroms to 30 angstroms.

The second adjustment layer 214 may be made of any appropriate material, such as silicon nitride, or silicon oxide, etc. The thickness of the second adjustment layer 214 may be in a range of approximately 10 angstroms to 35 angstroms.

The distance between the top surface of the second fin 212 and the surface of the edge region B of the semiconductor substrate 200 may be in a range of approximately 1000 angstroms to 1500 angstroms. The distance between the top surface of the first fin 211 and the surface of the middle region A of the semiconductor substrate 200 may be in a range of approximately 600 angstroms to 900 angstroms.

In the disclosed method for forming a semiconductor device, the first adjustment layer may be formed in the first opening, and the first adjustment layer may cover sidewall surfaces of the first fins. Because the thicknesses of the portions of the isolation structure at two sides of the first fins on the semiconductor substrate may be different, and the isolation structure may generate stresses on the first fins, the stress on the two sides of the first fins may be different. Thus, the first fins may be easily bent. The first adjustment layer formed in the first opening may stabilize the first fins covered by the first adjustment layer and prevent the first fins from bending. Accordingly, the performance of the semiconductor device may be improved.

Further, the second adjustment layer may prevent the first fins and the second fins from being etched when subsequently forming the first fins and the second fins. At the same time, the second adjusting layer covering the first fins may be able to further stabilize the first fins, and facilitate to resist the uneven force in the first fins due to the thickness difference of the isolation structure at two sides of the first fins. Accordingly, the bending of the first fins may be avoided; and the performance of the semiconductor device may be improved.

Further, the portion of the isolation structure in the edge region may be substantially thick, and the field isolation between the semiconductor device in the edge region and the surrounding semiconductor devices may be realized. The portion of the isolation structure of the middle region may be substantially thin, and may cover the sidewall surfaces of the first fins less. Thus, the semiconductor device formed on the first fins may be substantially close to the semiconductor substrate, and the heat is easily transferred to the semiconductor substrate. Accordingly, the heat dissipation may be substantially fast, and the self-heating effect of the semiconductor device may be reduced. Further, the height of the portion of the first fin higher than the isolation structure may be substantially the same as the height of the portion of the second fin higher than the isolation structure. Thus, the performance of the semiconductor device may be substantially stable; and the performance of the semiconductor device may be improved.

The above detailed descriptions only illustrate certain exemplary embodiments of the present disclosure, and are not intended to limit the scope of the present disclosure. Those skilled in the art can understand the specification as whole and technical features in the various embodiments can be combined into other embodiments understandable to those persons of ordinary skill in the art. Any equivalent or modification thereof, without departing from the spirit and principle of the present disclosure, falls within the true scope of the present disclosure.

What is claimed is:

1. A semiconductor structure, comprising:
    a semiconductor substrate having a middle region and an edge region adjacent to the middle region, wherein a top surface of the middle region of the semiconductor substrate is higher than a top surface of the edge region of the semiconductor substrate;
    a plurality of first fins formed on the middle region of the semiconductor substrate;
    a plurality of second fins formed on the edge region of the semiconductor substrate;
    a first adjustment layer formed on sidewall surfaces of the plurality of first fins and on the middle region of the semiconductor substrate; and
    an isolation structure formed on the semiconductor substrate and with a top surface lower than top surfaces of the plurality of first fins and the plurality of second fins.

2. The semiconductor device according to claim 1, further comprising:
    a second adjustment layer formed on portions of sidewall surfaces of the plurality of first fins and the plurality of second fins and sidewall surfaces of the first adjustment layer,
    wherein the isolation structure covers portions of sidewall surfaces of the second adjustment layer.

3. The semiconductor device according to claim 1, wherein:
    the first adjustment layer is made of one of silicon nitride and silicon oxide; and
    a thickness of the first adjustment layer is in a range of approximately 8 angstroms to angstroms.

4. The semiconductor device according to claim 2, wherein:
    the second adjustment layer is made of one of silicon nitride and silicon oxide; and
    a thickness of the second adjustment layer is in a range of approximately 10 angstroms to 35 angstroms.

5. The semiconductor device according to claim 1, wherein:
    a distance between a top surface of the second fin and the top surface of the edge region of the semiconductor substrate is in a range of approximately 1000 angstroms to 1500 angstroms; and
    a distance between a top surface of the first fin and the top surface of the middle region of the semiconductor substrate is in range of approximately 600 angstroms to 900 angstroms.

6. The semiconductor device according to claim 1, wherein:
    the isolation structure is made of one of silicon oxide and silicon nitride.

7. The semiconductor device according to claim 1, wherein:
    a bottom surface of the isolation structure in the middle region is higher than a bottom surface of the isolation structure in the edge region, and
    the top surface of the isolation structure in the middle region is coplanar with the top surface of the isolation structure in the edge region.

8. The semiconductor device according to claim 2, wherein:
    the second adjustment layer in the middle region is directly sandwiched by the first adjustment layer and the isolation structure in the middle region.

9. The semiconductor device according to claim 2, wherein:
    the first adjustment layer in the edge region is directly sandwiched by the plurality of second fins and the isolation structure in the middle region.

10. The semiconductor device according to claim 2, wherein:
    the top surface of the isolation structure is coplanar with a top surface of the first adjustment layer and a top surface of the second adjustment layer.

* * * * *